United States Patent
Von Fieandt et al.

(10) Patent No.: US 12,358,055 B2
(45) Date of Patent: *Jul. 15, 2025

(54) COATED CUTTING TOOL

(71) Applicant: AB SANDVIK COROMANT, Sandviken (SE)

(72) Inventors: Linus Von Fieandt, Stockholm (SE); Raluca Brenning, Stockholm (SE); Jan Engqvist, Stockholm (SE); Andreas Blomqvist, Stockholm (SE); Erik Holmstrom, Stockholm (SE)

(73) Assignee: AB Sandvik Coromant, Sandviken (SE)

( * ) Notice: Subject to any disclaimer, the term of this patent is extended or adjusted under 35 U.S.C. 154(b) by 200 days.

This patent is subject to a terminal disclaimer.

(21) Appl. No.: 18/038,641

(22) PCT Filed: Nov. 22, 2021

(86) PCT No.: PCT/EP2021/082474
§ 371 (c)(1),
(2) Date: May 24, 2023

(87) PCT Pub. No.: WO2022/112162
PCT Pub. Date: Jun. 2, 2022

(65) Prior Publication Data
US 2024/0033829 A1   Feb. 1, 2024

(30) Foreign Application Priority Data

Nov. 26, 2020   (EP) .................................... 20210116

(51) Int. Cl.
*B32B 27/14*   (2006.01)
*B23B 27/14*   (2006.01)
(Continued)

(52) U.S. Cl.
CPC ........ *B23B 27/148* (2013.01); *C23C 16/0272* (2013.01); *C23C 16/34* (2013.01);
(Continued)

(58) Field of Classification Search
None
See application file for complete search history.

(56) References Cited

U.S. PATENT DOCUMENTS 3,565,643 A * 2/1971 Bergna .................. C04B 35/117
501/87
2002/0102403 A1 * 8/2002 Leverenz ................ C23C 16/36
427/419.1
(Continued)

FOREIGN PATENT DOCUMENTS

EP   3034653 A1   6/2016
EP   3366796 A1   8/2018
(Continued)

OTHER PUBLICATIONS

Toller et al. "Investigation of cemented carbides with alternative binders after CVD coating", International Journal of Refractory Metals and Hard Materials, Elsevier, Amsterdam, NL. vol. 62, Jul. 5, 2016, pp. 225-229.

(Continued)

*Primary Examiner* — Kim S. Horger (74) *Attorney, Agent, or Firm* — Corinne R. Gorski (57) ABSTRACT

A coated cutting tool has a CVD coating and a substrate of a cemented carbide, wherein the metallic binder in the cemented carbide includes Ni. The CVD coating has an
(Continued)

inner layer of TiN and a subsequent layer of TiCN. A C-activity relative to graphite in the metallic binder is lower than 0.15 and an average d electron value of the metallic binder is 7.00-7.43, wherein an interface between the substrate and the inner TiN layer is free of Ti-containing intermetallic phase.

16 Claims, 6 Drawing Sheets

(51) Int. Cl.
    *C23C 16/02*      (2006.01)
    *C23C 16/34*      (2006.01)
    *C23C 16/36*      (2006.01)
    *C23C 16/40*      (2006.01)

(52) U.S. Cl.
    CPC ............ *C23C 16/36* (2013.01); *C23C 16/403* (2013.01); *B23B 2228/105* (2013.01)

(56) References Cited

U.S. PATENT DOCUMENTS

| | | | |
|---|---|---|---|
| 2012/0231227 A1 | 9/2012 | Kanaoka et al. | |
| 2016/0177426 A1* | 6/2016 | Trivedi | ................ C22C 29/005 75/238 |

FOREIGN PATENT DOCUMENTS

| | | |
|---|---|---|
| GB | 335453 A | 9/1930 |
| JP | 2003342667 A | 12/2003 |
| WO | 2012153858 A1 | 11/2012 |
| WO | 2020239718 A1 | 12/2020 |

OTHER PUBLICATIONS

Konyashin. : "Interaction between the TIC)TiCN)-Ni_Mo hardmetals and chromium vapours", Journal of Material Science, vol. 30, No. 22 Jan. 1, 1995, pp. 5723-5731.

J-O.Andersson et al. Thermo-Cal & DICTRA computational tools for material science, Calphad, 2022:26(2):2733212.

Zhixing et al. : "Adherent Ti(C,N) Coatings on Cemented Carbide Substrates with Fe/Ni/Co Binder", Metallurgical and Materials Transactions B, Springer-Verlag, New York, vol. 40, No. 6, Aug. 26, 2009, pp. 871-876.

* cited by examiner

COATED CUTTING TOOL

RELATED APPLICATION DATA

This application is a § 371 National Stage Application of PCT International Application No. PCT/EP2021/082474 filed Nov. 22, 2021 with priority to EP 20210116.8 filed Nov. 26, 2020.

TECHNICAL FIELD

The present invention relates to a coated cutting tool comprising a substrate and a coating, wherein the substrate is a cemented carbide wherein the metallic binder in the cemented carbide comprises Ni. The coating is a CVD coating comprising an inner layer of TiN and a layer of TiCN.

BACKGROUND

The market of cutting tools for chip forming metal cutting operations is dominated by CVD (Chemical Vapor Deposition) and PVD (Physical Vapor Deposition) coated cemented carbides wherein the cemented carbide is usually made of WC in a metallic binder of Co. Alternative metallic binders without Co or reduced amount of Co are being developed but are still rare or non-existing in the products on the market. Not only the production of the cemented carbide itself, but also the coating of the cemented carbide is demanding, especially during chemical vapor deposition which is performed using reactive gases at high temperature, since interactions occur between the gas phase and the cemented carbide.

Among the alternative metallic binders a mixture of Ni and Fe is a promising candidate: these two elements are on each side of Co in the periodic table. Ni shows a high reactivity with Ti and a high amount of Ni in the cemented carbide causes problems in chemical vapor deposition of a Ti-containing coating since intermetallic phases such as $Ni_3Ti$ forms at the interface between the cemented carbide and the coating and in the coating. Intermetallic phases such as $Ni_3Ti$ at the interface or in the inner part of the Ti-containing coating negatively influence the wear resistance of a coating subsequently deposited on the Ti-containing coating.

The problem of the formation of $Ni_3Ti$ during deposition of a TiN coating on Ni metal substrates is analyzed in "Chemical vapor deposition of TiN on transition metal substrates" by L. von Fieandt et al, Surface and Coatings Technology 334 (2018) 373-383. It was concluded that the formation of $Ni_3Ti$ could be reduced by an excess of $N_2$ partial pressure and low $H_2$ partial pressure during the CVD process.

It is an object of the present invention to provide a coated cutting tool for metal cutting with a Ni-containing cemented carbide substrate and with a high-performance wear resistant CVD coating. It is a further object to provide a wear resistant coating comprising a TiN layer, a TiCN layer and a 001 oriented α-$Al_2O_3$ on a Ni containing cemented carbide substrate, especially a substrate containing a metallic binder with more than 60 wt % Ni.

DESCRIPTION OF THE INVENTION

The present invention relates to a coated cutting tool comprising a substrate of cemented carbide and a coating, wherein the cemented carbide composed of hard constituents in a metallic binder and wherein said metallic binder comprises 68 to 80 mol % Ni, 5-25 mol % Fe, 0-10 mol % Co, 4-15 mol % W and wherein the coating comprises in order from the substrate an inner TiN layer and a TiCN layer, wherein the C-activity (carbon activity) relative to graphite in the metallic binder is lower than 0.15 and the averaged electron value of the metallic binder is 7.0-7.43 wherein an interface between the substrate and the inner TiN layer is free of Ti-containing intermetallic phase It was surprisingly found that a high quality of TiN and TiCN can be deposited on a cemented carbide substrate with a high Ni content in the metallic binder when the average d-electron value in the metallic binder is 7.0-7.43 and the C-activity relative to graphite is below 0.15. Coated cutting tools according to the present invention have surprisingly shown fewer pores at the inner part of the coating and this is promising for a wear resistant coating aimed for metal cutting applications. The inner TiN and the TiCN layer show improved properties relating to the formation of intermetallic phases, pores and disturbances relating to the orientation of the layer and subsequently deposited layers. Technical effects can be increased flank wear resistance and/or increased flaking resistance and/or increased crater wear resistance in metal cutting operations of for example steel.

The composition of the metallic binder in the cemented carbide have an impact on the quality of a layer deposited by CVD thereon, at least if a Ti-containing layer is to be deposited. TiN is a very common initial layer in cutting tool coatings. Without being bound to any theory the inventors have drawn the conclusion that during a CVD deposition of a TiN layer, $N_2$-molecules are believed to dissociate into N-atoms/N-radicals before they can react and form TiN. However, Ni in the surface increase the recombination rate of $N_2$ from N-atoms/radicals and thus passivates the N and prevents dissociation of N-atoms/radicals on the surface. Without N-atoms/radicals no TiN can form. Instead Ti might react with Ni forming $NiTi_3$ as described above. The reactivity of Ni in the metallic binder is influenced by the composition of the metallic binder. Further, it has been found that the number of d-electrons and the C-activity in the metallic binder is important.

The average number of d-electrons of the metallic binder is not only set by the components Co, Ni and/or Fe, it is also influenced by other metallic elements present in the alloy that is the metallic binder. For example, the W content have a relatively high impact on the average number of d-electrons in the metallic binder. The W content in the binder is highly influenced by the C content such that an excess of C results in lower W content and a lower C results in a higher W content in the metallic binder.

The C-activity is a thermodynamic measure of how easy carbon can react with other elements. It is expressed as a dimensionless quantity between 0 and 1. It is related to the concentration but takes properly into account all physical interactions that limit the whole amount of carbon to react. The definition of carbon activity is $$C\text{-activity}=\exp((\mu-\mu_{graf})/RT)$$

where μ is the chemical potential of carbon in the material, $\mu_{graf}$ is the chemical potential of carbon in pure graphite, R is the gas constant and T is the temperature. The carbon activity is a good measure of the position in the phase diagram, an activity close to 1 means that the cemented carbide is close to having free carbon in the microstructure, whereas a low value, close to 0.1, means that the cemented carbide is prone to having eta phase ($Me_6C$ and $Me_{12}C$ phases) in the microstructure.

Cemented carbide is herein meant a material comprising hard constituents distributed in a continuous metallic binder phase. This kind of material has properties combining a high hardness from the hard constituents with a high toughness from the metallic binder phase and is suitable as a substrate material for metal cutting tools. By "cemented carbide" is herein meant a material that comprises at least 50 wt % WC, possibly other hard constituents common in the art of making cemented carbides and a metallic binder.

The metallic binder of the cemented carbide can comprise elements that are dissolved in the metallic binder during sintering, such as W and C originating from the WC. Depending on what types of hard constituents that are present, also other elements can be dissolved in the binder.

By "cutting tool" is herein meant a cutting tool for metal cutting such as an insert, an end mill or a drill. The application areas can be turning, milling or drilling.

By intermetallic phase is herein meant a metal alloy of two or more metallic elements. By Ti-containing intermetallic phase one of these metallic elements is Ti.

In one embodiment of the present invention the Ti-containing intermetallic phase is $Ni_3Ti$.

Presence of Ti-containing intermetallic phase in the interphase and/or in the part of the TiN layer adjacent to the substrate influences the growth of the TiN layer and also of subsequent layers. The intermetallic phases disturb a columnar growth and pores are commonly found in combination with the intermetallic phases. Normally the TiN and the subsequent TiCN grow with columnar grains, and in an analyze in SEM of a sample with intermetallic phases present, a disturbed growth is found.

In one embodiment of the present invention the C-activity in the metallic binder is 0.095-0.12.

In one embodiment of the present invention the interface between the substrate and the coating is free of Ti- and Ni-containing intermetallic phase.

In one embodiment of the present invention the interface between the substrate and the coating is free of Ti-, Fe- and Ni-containing intermetallic phase.

In one embodiment of the present invention the average d electron value is 7.25-7.43.

In one embodiment of the present invention the average d electron value is 7.36-7.43.

In one embodiment of the present invention the metallic binder comprises 73 to 80 mol % Ni, 5-15 mol % Fe, 1-5 mol % Co, 8-13 mol % W.

In one embodiment of the present invention the metallic binder content in the cemented carbide is 3-20 wt %, preferably 5-15 wt %, most preferably 7-12 wt %.

In one embodiment of the present invention the total thickness of the coating is 2-20 µm. The coating is preferably a CVD coating.

In one embodiment of the present invention the thickness of the TiN layer is 0.1-1 µm, preferably deposited on the cemented carbide substrate.

In one embodiment of the present invention the thickness of the TiCN layer is 6-12 µm.

In one embodiment of the present invention the wherein the coating comprises an $\alpha$-$Al_2O_3$ layer located between the TiCN layer and an outermost surface of the coated cutting tool.

In one embodiment of the present invention the thickness of the $Al_2O_3$ layer located between the TiCN layer and an outermost surface of the coated cutting tool is 4-8 µm.

In one embodiment of the present invention the $\alpha$-$Al_2O_3$ layer exhibits a texture coefficient TC(h k l), as measured by X-ray diffraction using CuKα radiation and θ-2θ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1} \quad (1)$$

where I(h k l) is the measured intensity (integrated area) of the (h k l) reflection, $I_0$(h k l) is the standard intensity according to ICDD's PDF-card No. 00-010-0173, n is the number of reflections used in the calculation, and where the (h k l) reflections used are (1 0 4), (1 1 0), (1 1 3), (0 2 4), (1 1 6), (2 1 4), (3 0 0) and (0 0 12), wherein TC(0 0 12)≥6, preferably ≥7.

In one embodiment of the present invention the coating further comprises one or more layers selected from TiN, TiCN, AlTiN, ZrCN, $TiB_2$, $Al_2O_3$, or multilayers comprising $\alpha$-$Al_2O_3$ and/or $\kappa$-$Al_2O_3$.

In one embodiment of the present invention the cemented carbide substrate comprises eta phase. By eta phase is herein meant carbides selected from $Me_6C$ and $Me_{12}C$ where Me is selected from W and one or more of the binder phase metals. Common carbides are $W_6Co_6C$, $W_3Co_3C$, $W_6Ni_6C$, $W_3Ni_3C$, $W_6Fe_6C$, $W_3Fe_3C$.

In on embodiment the cemented carbide substrate comprises carbides, carbonitrides or nitrides of one or more of Ti, Ta, Nb, Cr, Mo, Zr or V.

BRIEF DESCRIPTION OF DRAWINGS

Embodiments of the invention and also references will be described with reference to the accompanying drawings, wherein.

METHODS

Figure 1:
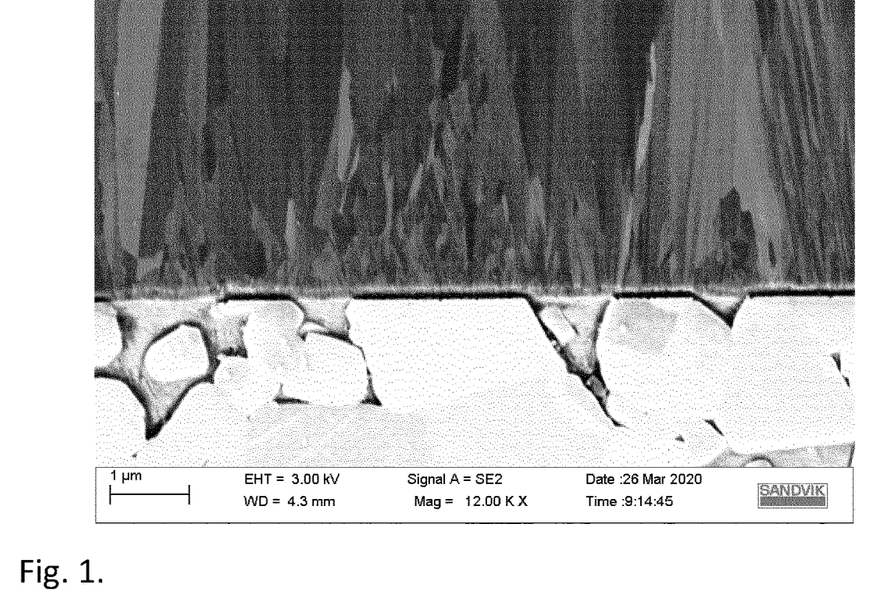
FIG. 1 is a cross-sectional SEM micrograph showing the substrate coating interface of a coated cutting tool, NF70e with the coating of CVD process 1 (invention)
Figure 2:
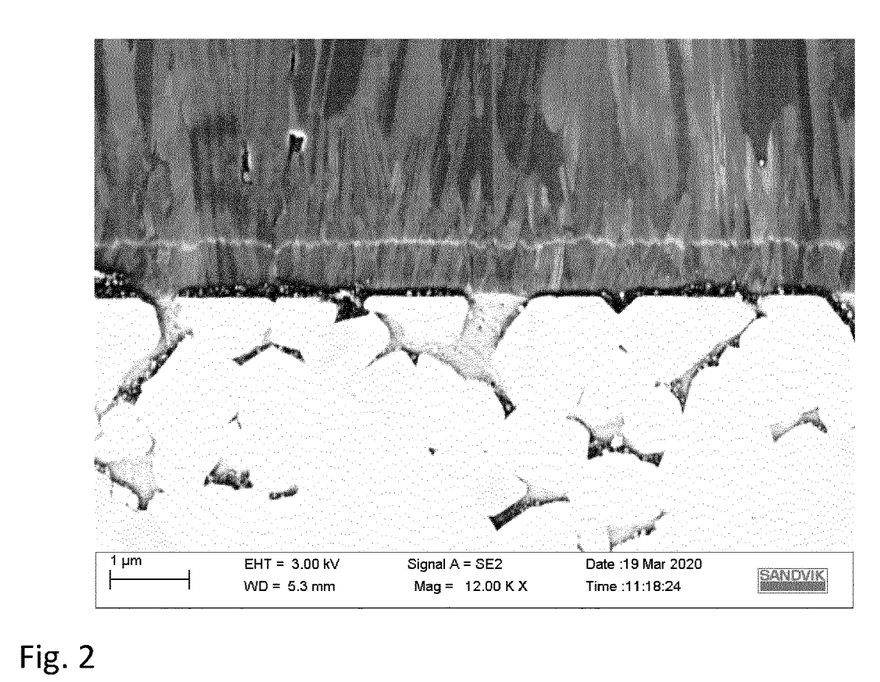
FIG. 2 is a cross-sectional SEM micrograph showing the substrate coating interface of a coated cutting tool, NF70e with the coating of CVD process 2 (invention)
Figure 3:
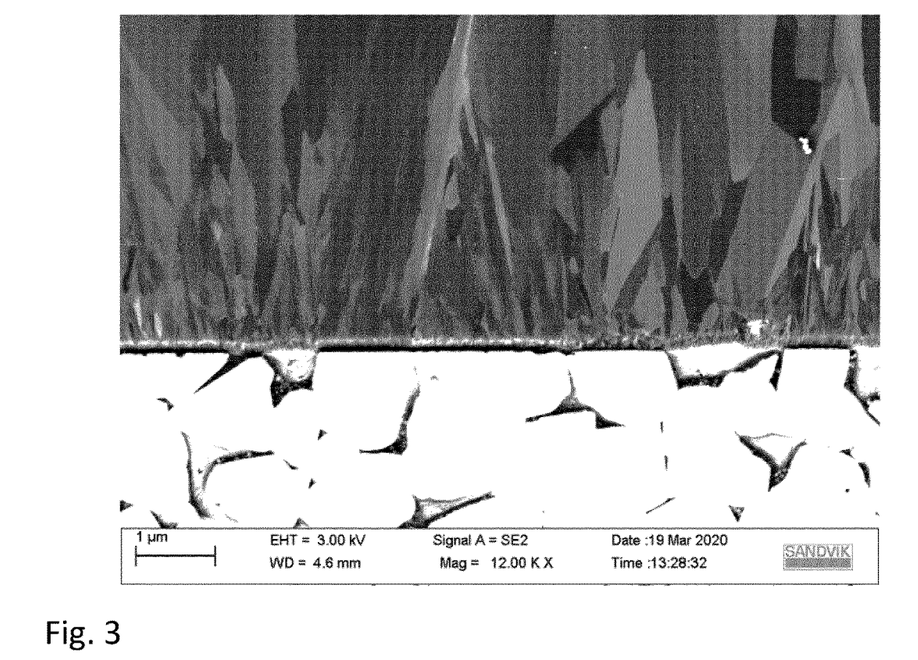
FIG. 3 is a cross-sectional SEM micrograph showing the substrate coating interface of a coated cutting tool, NF80e with the coating of CVD process 1 (invention)
Figure 4:
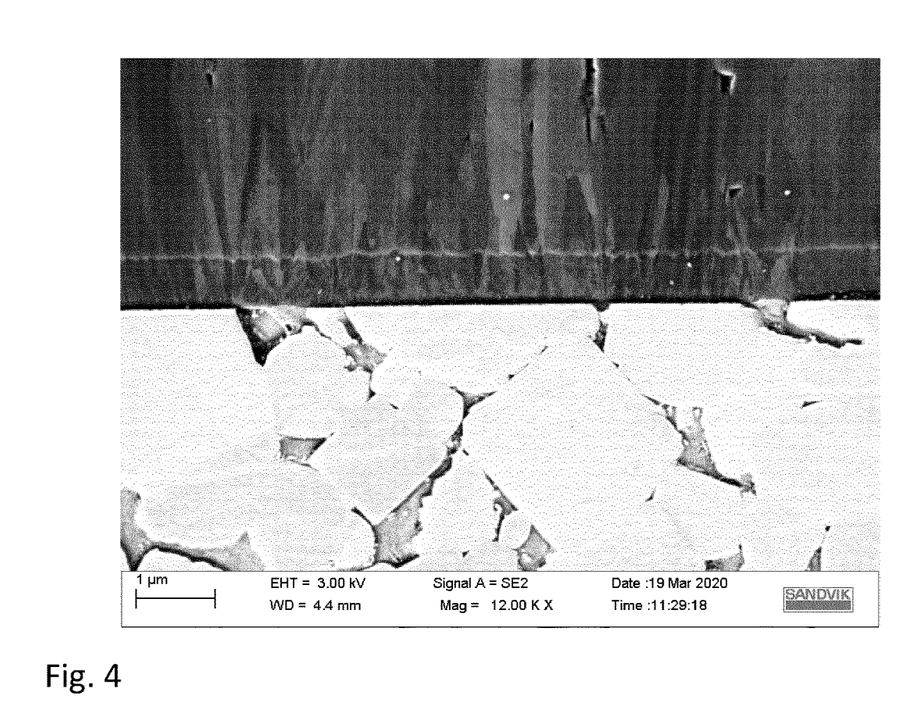
FIG. 4 is a cross-sectional SEM micrograph showing the substrate coating interface of a coated cutting tool, NF80e with the coating of CVD process 2 (invention)
Figure 5:
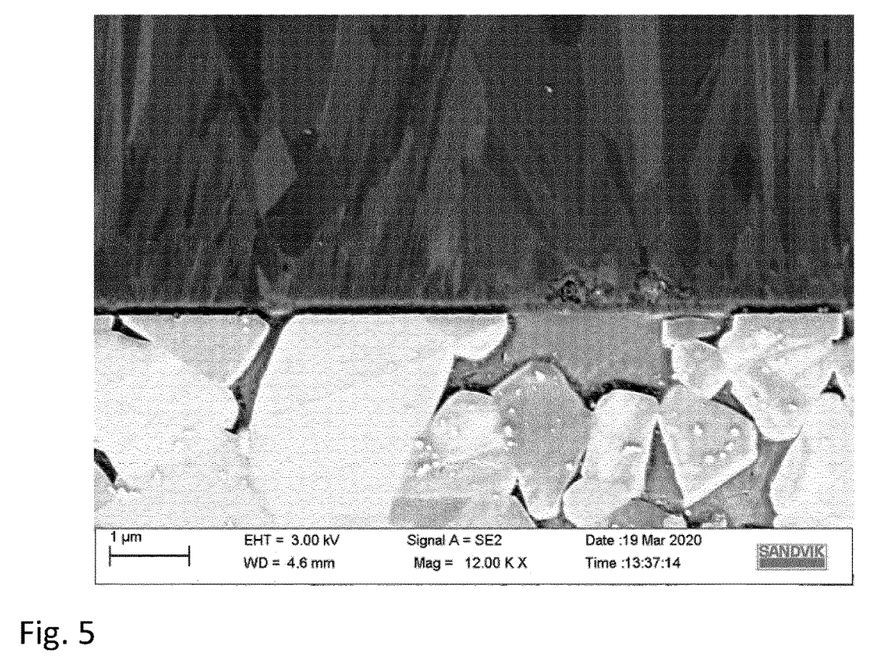
FIG. 5 is a cross-sectional SEM micrograph showing the substrate coating interface of a coated cutting tool, NF85e with the coating of CVD process 1 (invention)
Figure 6:
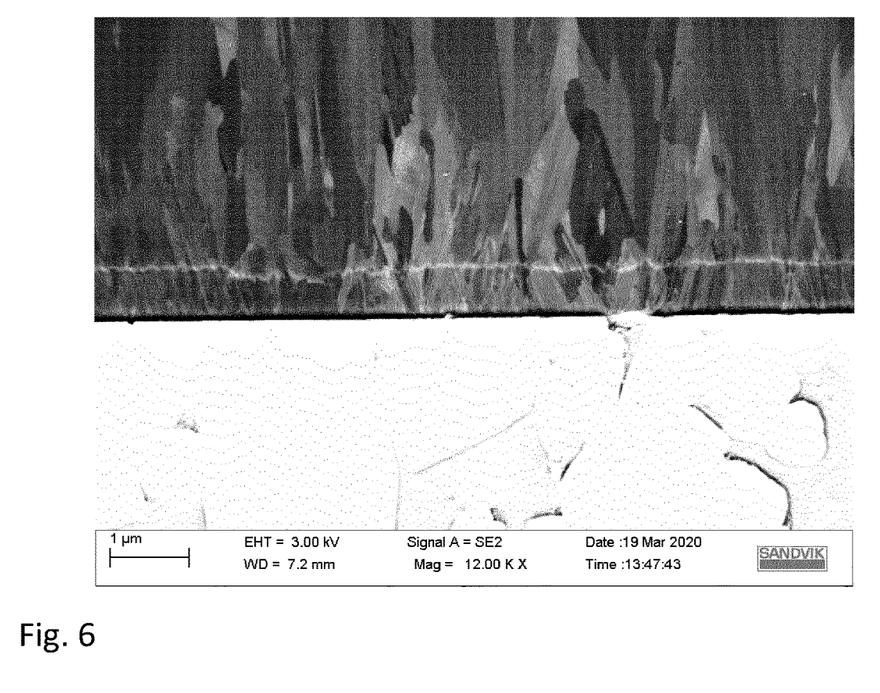
FIG. 6 is a cross-sectional SEM micrograph showing the substrate coating interface of a coated cutting tool, NF85e with the coating of CVD process 2 (invention)
Figure 7:
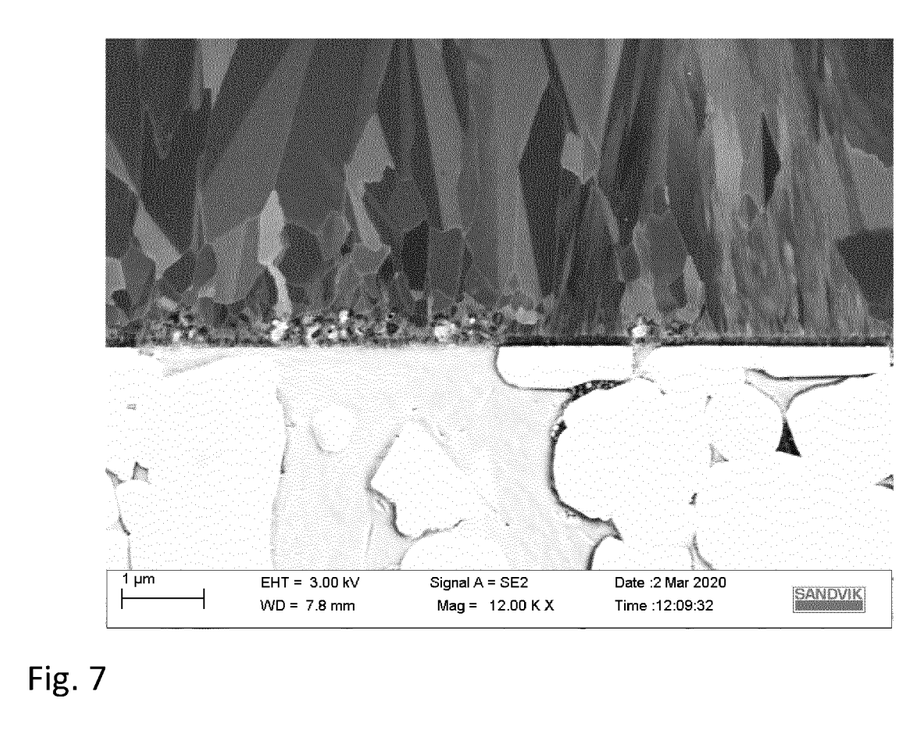
FIG. 7 is a cross-sectional SEM micrograph showing the substrate coating interface of a coated cutting tool, NF90e with the coating of CVD process 1 (reference)
Figure 8:
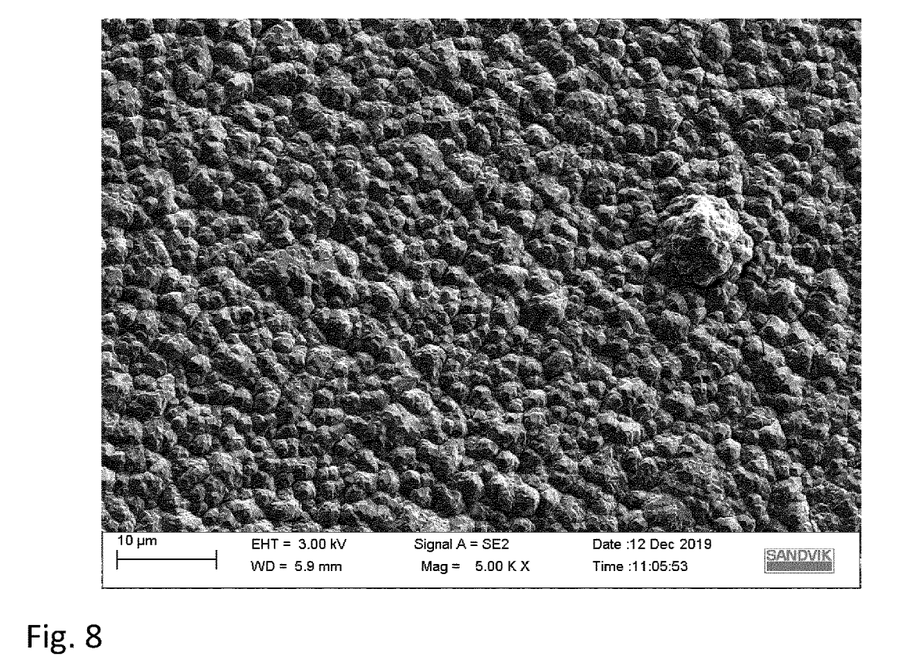
FIG. 8 is a top view SEM micrograph showing the outer surface of a coated cutting tool, substrate NF90e with the coating of CVD process 1 (reference)
Figure 9:
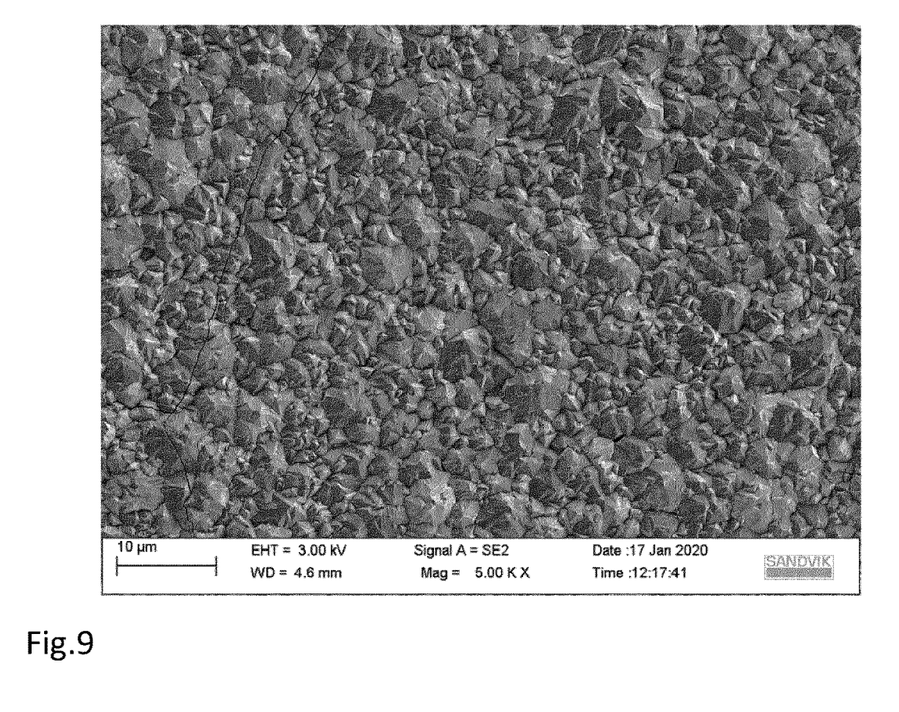
FIG. 9 is a top view SEM micrograph showing the outer surface of a coated cutting tool, substrate NF90e with the coating of CVD process 2 (invention)
Figure 10:
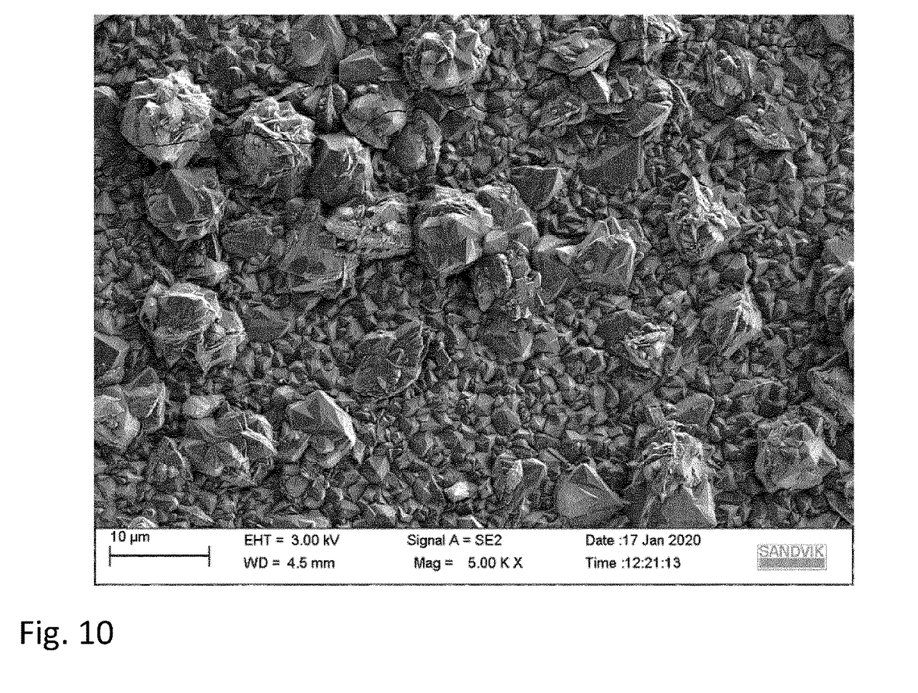
FIG. 10 is top view SEM micrograph showing the outer surface of a coated cutting tool, substrate NF90f with the coating of CVD process 2 (reference)
Figure 11:
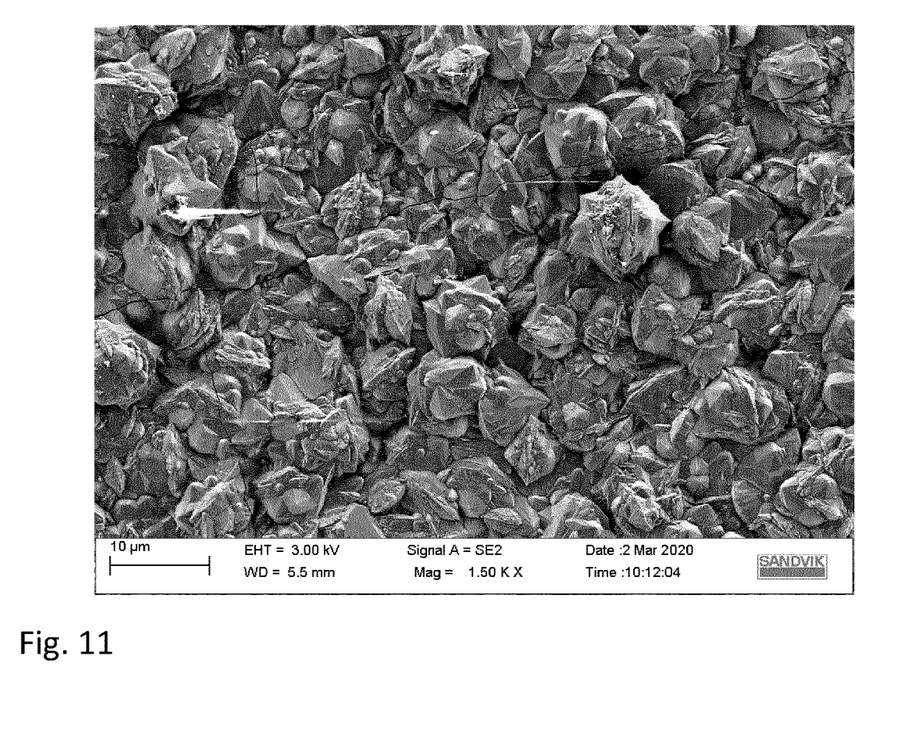
FIG. 11 is top view SEM micrograph showing the outer surface of a coated cutting tool, substrate N100f with the coating of CVD process 2 (reference).

The cemented carbide substrate of the invention can be made according to the following steps:
- providing powders forming or being hard constituents such as W, Ta, Cr, C, WC, TiC, etc.
- providing powders forming metallic binder such as Co, Fe, Ni
- providing milling liquid
- milling, drying, pressing and sintering the powders into cemented carbide substrates.

During sintering oxygen will react with carbon and leave the substrate as CO or $CO_2$. Exactly how much carbon that is lost during sintering depends on the raw material and production techniques used and it is up to the person skilled in the art to adjust the amount of each component so that the aimed sintered material is achieved.

The C content in the cemented carbide was analyzed with carbon combustion analysis in a LECO 844 Series instrument. The C content in the cemented carbide is measured in the sintered substrate. Some of the C that is mixed in the powder during the production of the cemented carbide is consumed during sintering, some carbon can dissolve in the metallic binder and some carbon might form carbides.

The present invention is related to the composition of the metallic binder, and since it is expensive and complicated to produce samples the composition was calculated with a software called Thermo-Calc. The composition of the metallic binder can alternatively be measured with XRF (X-ray fluorescence).

Thermo-Calc is a software package that is world-wide used by material scientists, researchers and industry in the field of materials engineering for development and production of both materials and components. The development of the Thermo-Calc software was started already in the mid 70's at the department for physical metallurgy at the Royal Institute of Technology in Stockholm, Sweden, and in 1997 Thermo-Calc Software AB was founded. More information can be found at: www.thermocalc.com. Thermo-Calc provides for example thermodynamic calculations of the amounts of phases and their compositions and the phase diagrams (binary, ternary and multi-component).

The calculations made with Thermo-Calc are based on thermodynamic data which is supplied in high-quality databases for various purposes that include many different materials. The databases are produced by experts through assessment and systematic evaluation of experimental and theoretical data, following the well-established so-called CALPHAD technique. The databases provided by Thermo-Calc Software AB are validated against experimental data to evaluate their accuracy in the calculated predictions.

The database used herein for the Thermo-Calc calculations was "TCFE7" commercially available from Thermo-Calc Software AB. TCFE7 is a thermodynamic database for different kinds of steels, Fe-based alloys (stainless steels, high-speed steels, tool steels, HSLA steels, cast iron, corrosion-resistant high strength steels and more) and cemented carbides. The TCFE7 database is validated against experimental data and shows accurate predictions, among others, for cemented carbides, especially in predicting correct phases and fractions, phase compositions and solid/liquid equilibrium temperatures.

The composition of the metallic binder in the present invention was determined using Thermo-Calc software which is further described in [J.-O. Andersson, T. Helander, L. Hoglund, P. Shi, and B. Sundman, Thermo-Calc & DICTRA, computational tools for material science, Calphad, 2002:26(2):273312].

The Thermo-Calc calculations of the present invention was made with the criterions: atmospheric pressure, a temperature of 1000° C., one mole of substance, weighed in compositions of Ni, Fe, and Co with the addition of milled in Co, C level from chemical analysis and balance of W.

When the composition of the metallic binder, in mol %, is known the average number of d electrons is calculated as follows: The d-electrons are counted as the number of electrons in the highest d-orbital per element, e.g. 6 for Fe, 7 for Co, 8 for Ni, 0 for C, and 4 for W.

The coatings in the examples below were deposited in a radial Ionbond Bernex™ type CVD equipment 530 size capable of housing 10000 half-inch size cutting inserts.

In order to investigate the texture of the layer(s) X-ray diffraction was conducted on the flank face and the rake face of cutting tool inserts using a Xpert-Pro diffractometer system equipped with a X'Celerator RTMS detector type. The coated cutting tool inserts were mounted in sample holders to ensure that the surface of the cutting tool inserts was parallel to the reference surface of the sample holder and also that the cutting tool surface was at appropriate height. Cu-Kα radiation was used for the measurements, with a voltage of 45 kV and a current of 40 mA. A 0.02 radian soller slit and a 0.25 degree divergence slit were used for the incident beam path. For the diffracted beam a 0.25 degree anti-scatter slit and 0.02 radian soller slit were used. The Beta-filter Nickel had a thickness of 0.020 mm. The diffracted intensity from the coated cutting tool was measured in the range 15° to 140° 2θ, i.e. over an incident angle θ range from 10 to 70°.

The data analysis, including background subtraction, $Cu-K_{\alpha 2}$ stripping and profile fitting of the data, was done using PANalytical's X'Pert HighScore Plus software. A general description of the fitting is made in the following. The output (integrated peak areas for the profile fitted curve) from this program was then used to calculate the texture coefficients of the layer by comparing the ratio of the measured intensity data to the standard intensity data according to a PDF-card of $\alpha\text{-}Al_2O_3$, using the Harris formula (1) as disclosed above. Since the layer is finitely thick the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above the $\alpha\text{-}Al_2O_3$ layer will affect the X-ray intensities entering the $\alpha\text{-}Al_2O_3$ layer and exiting the whole coating, corrections need to be made for these as well, taken into account the linear absorption coefficient for the respective compound in a layer. Alternatively, a further layer, such as TiN, above an alumina layer can be removed by a method that does not substantially influence the XRD measurement results, e.g. chemical etching.

In order to investigate the texture of the $\alpha\text{-}Al_2O_3$ layer X-ray diffraction was conducted using CuKα radiation and texture coefficients TC (h k l) for different growth directions of the columnar grains of the $\alpha\text{-}Al_2O_3$ layer were calculated according to Harris formula (1), where I(h k l)=measured (integrated area) intensity of the (h k l) reflection, $I_0$(h k l)=standard intensity according to ICDD's PDF-card no 00-010-0173, n=number of reflections to be used in the calculation. In this case the (h k l) reflections used are: (1 0 4), (1 1 0), (1 1 3), (0 2 4), (1 1 6), (2 1 4), (3 0 0) and (0 0 12).

It is to be noted that peak overlap is a phenomenon that can occur in X-ray diffraction analysis of coatings comprising for example several crystalline layers and/or that are deposited on a substrate comprising crystalline phases, and this has to be considered and compensated for. An overlap of peaks from the α-Al$_2$O$_3$ layer with peaks from the TiCN layer might influence measurement and needs to be considered. It is also to be noted that for example WC in the substrate can have diffraction peaks close to the relevant peaks of the present invention.

Examples

Exemplifying embodiments of the present invention will now be disclosed in more detail and compared to reference embodiments. Coated cutting tools (inserts) were manufactured and analyzed.

Cemented carbide substrates of ISO-type SNUN120408 were manufactured. The cemented carbide substrates were manufactured with WC in a metallic binder, wherein the metallic binder content was about 10 wt %. The cemented carbide substrates were manufactured from a powder mixture. The powder mixture was milled, dried, pressed and sintered at 1450° C. WC/Co milling bodies were used during the milling and mixing step. The amount carbon in the powder was about 6.07 wt %, while the amount carbon as measured in chemical analysis of the sintered cemented carbide is presented in table 1A and 1B. The sintered cemented carbide comprised about 0.4 wt % Co originating mainly from the milling bodies that were worn during the milling step. No free graphite was visible in a SEM micrograph of a cross section of the cemented carbide substrates.

The C level of the substrates was measured with LECO carbon combustion. The compositions of the cemented carbide substrates are listed in wt % in table 1A, so called e-samples, and 1B, so called f-samples.

TABLE 1A

Summary of cemented carbide substrates, e-samples

| Substrate | Ni [wt %] | Co [wt %] | Fe [wt %] | C [wt %] | W [wt %] |
|---|---|---|---|---|---|
| NF70e | 7.14 | 0.40 | 2.91 | 5.35 | 84.20 |
| NF80e | 8.12 | 0.40 | 1.93 | 5.36 | 84.19 |
| NF85e | 8.60 | 0.40 | 1.44 | 5.30 | 84.25 |
| NF90e | 9.04 | 0.40 | 0.96 | 5.26 | 84.34 |
| N100e | 10.05 | 0.40 | 0.00 | 5.16 | 84.39 |

TABLE 1B

Summary of cemented carbide substrates, f-samples

| Substrate | Ni [wt %] | Co [wt %] | Fe [wt %] | C [wt %] | W [wt %] |
|---|---|---|---|---|---|
| NF70f | 7.19 | 0.40 | 2.93 | 5.45 | 84.02 |
| NF80f | 8.16 | 0.40 | 1.94 | 5.43 | 84.07 |
| NF85f | 8.68 | 0.40 | 1.46 | 5.41 | 84.05 |
| NF90f | 9.14 | 0.40 | 0.97 | 5.40 | 84.09 |
| N100f | 10.16 | 0.40 | 0.00 | 5.29 | 84.15 |

The composition of the metallic binder was calculated with Thermo-Calc using the following conditions: atmospheric pressure, a temperature of 1000° C., one mole of substance, weighed in compositions of Ni, Fe, and Co with the addition of milled in Co, C level from chemical analysis and balance of W. The resulting binder compositions, excluding carbides, are listed in mol % in table 2A (e-samples) and 2B (f-samples).

To calculate the average number of d-electrons in the binder, the calculated composition of the metallic binder is used. The d-electrons are counted as the number of electrons in the highest d-orbital per element, e.g. 6 for Fe, 7 for Co, 8 for Ni, 0 for C, and 4 for W. The average number of d electrons in the binders are presented in table 2A and 2B.

To calculate the carbon activity of the cemented carbide, first the chemical composition must be known. In the present examples the C-activity calculation is based on the values presented in Tables 1A and 1B. In an unknown sample, this can be measured by means of e.g. XRF.

A Thermo-Calc calculation of the thermodynamic equilibrium is performed at, atmospheric pressure, a temperature of 1000° C., one mole of substance, compositions of Ni, Fe, Co, and C from chemical analysis and balance of W. The carbon activity relative to graphite at this equilibrium is then extracted as an output parameter from Thermo-Calc, see Tables 2A and 2B.

TABLE 2A

Summary of metallic binder, e-samples

| Substrate | Ni [mol %] | Co [mol %] | Fe [mol %] | C [mol %] | W [mol %] | Average number of d electrons | C-activity |
|---|---|---|---|---|---|---|---|
| NF70e | 64.42 | 3.58 | 27.42 | 0.11 | 4.46 | 7.23 | 0.101 |
| NF80e | 72.10 | 3.54 | 18.02 | 0.13 | 6.22 | 7.35 | 0.106 |
| NF85e | 75.35 | 3.47 | 13.29 | 0.13 | 7.75 | 7.38 | 0.099 |
| NF90e | 78.50 | 3.43 | 8.71 | 0.15 | 9.21 | 7.41 | 0.101 |
| N100e | 84.08 | 3.28 | 0.00 | 0.21 | 12.43 | 7.45 | 0.098 |

TABLE 2B

Summary of metallic binder, f-samples

| Substrate | Ni [mol %] | Co [mol %] | Fe [mol %] | C [mol %] | W [mol %] | Average number of d electrons | C-activity |
|---|---|---|---|---|---|---|---|
| NF70f | 65.87 | 3.65 | 28.23 | 0.25 | 2.00 | 7.30 | 0.281 |
| NF80f | 74.43 | 3.63 | 18.61 | 0.28 | 3.05 | 7.45 | 0.316 |
| NF85f | 78.35 | 3.60 | 13.83 | 0.32 | 3.90 | 7.51 | 0.331 |
| NF90f | 82.29 | 3.59 | 9.14 | 0.43 | 4.55 | 7.56 | 0.281 |
| N100f | 87.05 | 3.41 | 0.00 | 0.41 | 9.12 | 7.57 | 0.240 |

CVD coatings were deposited on the cemented carbide compositions presented in Table 2A and Table 2B and a summary of the CVD coatings are given in Table 3. Prior to the coating deposition the rake faces were polished to remove the outermost metal from the surfaces, the flank face was left unpolished. The polishing was performed by mounting each of SNUN120408 samples in a black conductive phenolic resin from AKASEL which were afterwards ground down about 1 mm and then polished in two steps: rough polishing (9 μm) and fine polishing (1 μm) using a diamond slurry solution. After polishing the SNUN120408 sample were taken out from the black conductive phenolic resin and washed in ethanol before coating.

TABLE 3

Summary of CVD processes

| CVD process | TiN-1 | TiN-2 | TiN total [µm] | TiCN [µm] | bonding layer [µm] | α-Al$_2$O$_3$ [µm] |
|---|---|---|---|---|---|---|
| Process CVD 1 (normal) | No | Yes | 0.2 | 8.5 | 0.9 | 5.4 |
| Process CVD 2 (modified) | Yes | Yes | 0.7 | 10 | 0.9 | 5.2 |

Before starting the CVD deposition the CVD chamber was heated up to reach 885° C. The pre-heating step was performed at 1000 mbar and in 100 vol % H$_2$ for both Process CVD 1 and Process CVD 2.

In the Process CVD 1 the substrates were first coated with an about 0.2-0.3 µm thick TiN-layer at 885° C., process TiN-2. In the Process CVD 2 two alternative depositions of TiN were performed: an initial step of TiN-1 followed by process TiN-2. The aim of the TiN-1 step is to prevent intermetallic phases such as Ni$_3$Ti from forming in the CVD coating and at the substrate-coating interface. During the TiN-1 deposition the N$_2$ partial pressure was high and the H$_2$ partial pressure was low, and HCl was added, as compared to the TiN-2 deposition step which was performed without HCl and with a 50/50 relation for the H$_2$/N$_2$ gasses. When the TiN-1 was deposited, the subsequent TiN-2 deposition time was adapted to reach a total TiN layer thickness of 0.7 µm. The TiN-1 deposition was run for 150 minutes.

Thereafter an approximately 8 µm TiCN layer was deposited by employing the well-known MTCVD technique using TiCl$_4$, CH$_3$CN, N$_2$, HCl and H$_2$ at 885° C. The volume ratio of TiCl$_4$/CH$_3$CN in an initial part of the MTCVD deposition of the TiCN layer was 6.6, followed by a period using a ratio of TiCl$_4$/CH$_3$CN of 3.7. The details of the TiN and the TiCN deposition are shown in Table 4.

TABLE 4

MTCVD of TiN and TiCN

| MT CVD of TiN and TiCN (885° C.): | Pressure [mbar] | H$_2$ [vol %] | N$_2$ [vol %] | HCl [vol %] | TiCl$_4$ [vol %] | CH$_3$CN [vol %] |
|---|---|---|---|---|---|---|
| TiN-1 | 1000 | 10.5 | 87.4 | 0.88 | 1.25 | — |
| TiN-2 | 400 | 48.8 | 48.8 | — | 2.44 | — |
| TiCN inner | 55 | 59.0 | 37.6 | — | 2.95 | 0.45 |
| TiCN outer | 55 | 81.5 | 7.8 | 7.8 | 2.38 | 0.65 |

After the deposition of the TiCN outer layer the temperature was increased from 885° C. to 1000° C. in an atmosphere of 75 vol % H$_2$ and 25 vol % N$_2$ at 55 mbar for the Process CVD 1 After the deposition of the TiCN outer layer the temperature was increased from 885° C. to 1000° C. in an atmosphere of 100 vol % N$_2$ at 1000 mbar for the Process CVD 2.

A 1-2 µm thick bonding layer was deposited at 1000° C. on top of the MTCVD TiCN layer by a process consisting of four separate reaction steps. First a HTCVD TiCN step using TiCl$_4$, CH$_4$, N$_2$, HCl and H$_2$ at 400 mbar, then a second step (TiCNO-1) using TiCl$_4$, CH$_3$CN, CO, N$_2$ and H$_2$ at 70 mbar, then a third step (TiCNO-2) using TiCl$_4$, CH$_3$CN, CO, N$_2$ and H$_2$ at 70 mbar and finally a fourth step (TiN-3) using TiCl$_4$, N$_2$ and H$_2$ at 70 mbar. Prior to the start of the subsequent Al$_2$O$_3$ nucleation, the bonding layer was oxidized for 4 minutes in a mixture of CO$_2$, CO, N$_2$ and H$_2$.

The details of the bonding layer deposition are shown in Table 5.

TABLE 5

Bonding layer deposition

| Bonding layer | Pressure [mbar] | H$_2$ [vol %] | N$_2$ [vol %] | CH$_4$ [vol %] | HCl [vol %] | CO [vol %] | TiCl$_4$ [vol %] | CH$_3$CN [vol %] | CO$_2$ [vol %] |
|---|---|---|---|---|---|---|---|---|---|
| HTCVD TiCN | 400 | 67.9 | 25.5 | 3.4 | 1.7 | — | 1.55 | — | — |
| TiCNO-1 | 70 | 83.7 | 12.0 | — | 1.2 | 1.2 | 1.5 | 0.40 | — |
| TiCNO-2 | 70 | 63.1-61.1 | 31.5-30.6 | — | — | 1.6-4.6 | 3.15-3.06 | 0.65-0.63 | — |
| TiN-3 | 70 | 64.5 | 32.3 | — | — | — | 3.23 | — | — |
| Oxidation | 55 | 53.8 | 30 | — | — | 12.5 | — | — | 3.7 |

On top of the bonding layer an α-Al$_2$O$_3$ layer was deposited. All the α-Al$_2$O$_3$ layers were deposited at 1000° C. and 55 mbar in two steps. The first step using 1.2 vol-% AlCl$_3$, 4.7 vol-% CO$_2$, 1.8 vol-% HCl and balance H$_2$ giving about 0.1 µm α-Al$_2$O$_3$ and a second step as disclosed below giving a total α-Al$_2$O$_3$ layer thickness of about 5 µm. The second step of the α-Al$_2$O$_3$ layer was deposited using 1.2% AlCl$_3$, 4.7% CO$_2$, 3.0% HCl, 0.58% H$_2$S and balance H$_2$.

XRD was used to analyse the texture coefficient (TC) values of the α-Al$_2$O$_3$ in accordance with the method as disclosed above. The layer thicknesses were analyzed in a Carl Zeiss AG-Supra 40SEM (Scanning Electron Microscope) type by studying a cross section of each coating at 12000× magnification and both the bonding layer and the initial TiN layer are included in the TiCN layer thickness, see Table 1. Both the polished rake face and the unpolished flank face were studied. The results from the XRD are presented in Table 6A and 6B.

TABLE 6A

XRD results (e-samples)

| | TC(0 0 12) of α-Al$_2$O$_3$ flank face | | TC(0 0 12) of α-Al$_2$O$_3$ polished rake face | |
|---|---|---|---|---|
| Sample | Process CVD 1 | Process CVD 2 | Process CVD 1 | Process CVD 2 |
| NF70e | Not analyzed | Not analyzed | Not analyzed | 7.78 |
| NF80e | 6.96 | Not analyzed | Not analyzed | 7.77 |
| NF85e | 6.49 | 6.93 | 7.64 | 7.73 |
| NF90e | 6.82 | 6.56 | 7.66 | 7.79 |

TABLE 6B

XRD results (f-samples)

| Sample | TC(0 0 12) of α-Al$_2$O$_3$ flank face | | TC(0 0 12) of α-Al$_2$O$_3$ polished rake face | |
|---|---|---|---|---|
| | Process CVD 1 | Process CVD 2 | Process CVD 1 | Process CVD 2 |
| NF70f | 6.81 | Not analyzed | Not analyzed | 7.75 |
| NF80f | 6.88 | Not analyzed | Not analyzed | 7.76 |
| NF85f | 5.68 | 6.74 | 7.34 | 7.69 |
| NF90f | Not analyzed | Not analyzed | 5.58 | 6.98 |
| N100f | Not analyzed | Not analyzed | Not analyzed | 1.53 |

The coatings were also analyzed using SEM to study the presence of any Ni and Fe compounds at the interface between substrate and the first TiN layer.

Top view images of the coated samples showed an unevenness or high surface roughness on the outer surface of the alumina. It was concluded that formation of intermetallic phases at the interface could be identified by studying the outer surface of the alumina in that an unexpectedly rough surface indicated intermetallic phases at the interface.

Cross section images were mainly focused at the interface between the substrate and the first TiN layer to determine if diffusion of binder elements (Ni and Fe compounds) had disturbed the growth of the coating. Occurrence of Ti-containing intermetallic phases (such as Ni$_3$Ti) depended on the binder composition.

The coating quality deposited in the Process CVD 1 and the Process CVD 2 on Ni rich binders was determined by analyzing both the outer surface and morphology of Al$_2$O$_3$ and also the interface between substrate and the first TiN layer. Unevenness of Al$_2$O$_3$ surface can result from growth of coarse grains and correlates with the formation of intermetallic phases such as Ni$_3$Ti formed at the interface between the substrate and the coating. When the unevenness of the Al$_2$O$_3$ was difficult to determine the interface between the substrate and coating was analyzed to determine the coating quality. For this investigation, SEM was used at 12000× magnification and 3 parallel images were studied from 3 places on the sample approximatively 10 μm apart along the substrate surface in order to detect presence of intermetallic phases. The results of the analyses are shown in Tables 7A and 7B.

TABLE 7A

SEM analyse of e-samples

| Sample | Ti-containing intermetallic phases identified in interface (cross section) | | Visual unevenness or high surface roughness on outer surface of alumina (top view) | |
|---|---|---|---|---|
| | Process CVD 1 | Process CVD 2 | Process CVD 1 | Process CVD 2 |
| NF70e | No | No | No | No |
| NF80e | No | No | No | No |
| NF85e | Yes | No | Yes | No |
| NF90e | Yes | Not analyzed | Yes | No |
| N100e | Yes | Not analyzed | Not analyzed | Yes |

TABLE 7B

SEM analyse of f-samples

| Sample | Ti-containing intermetallic phases identified in interface (SEM cross section) | | Visual unevenness or high surface roughness on outer surface of alumina (SEM top view) | |
|---|---|---|---|---|
| | Process CVD 1 | Process CVD 2 | Process CVD 1 | Process CVD 2 |
| NF70f | No | No | No | No |
| NF80f | Yes | No | Yes | No |
| NF85f | Yes | No | Yes | No |
| NF90f | Yes | Not analyzed | Yes | Yes |
| N100f | Yes | Not analyzed | Yes | Yes |

It is clear from the surface analysis and the cross section analysis that samples showing visual unevenness or high surface roughness on the outer surface of the alumina (top view) also showed Ti-containing intermetallic phases in the interface (cross section). It is unexpected that no Ti-containing intermetallic phases or disturbing pores appears at the interface of the CVD coating when the C-activity is low, lower than 0.15, and the average number of d electrons are 7.0-7.43, see Table 8.

TABLE 8

Summary of results

| Substrate partial name | e-samples | | f-samples | |
|---|---|---|---|---|
| | d-electrons | C-activity | d-electrons | C-activity |
| NF70 | 7.23* | 0.101 | 7.30* | 0.281 |
| NF80 | 7.35* | 0.106 | 7.45** | 0.316 |
| NF85 | 7.38** | 0.099 | 7.51** | 0.331 |
| NF90 | 7.41** | 0.101 | 7.56*** | 0.281 |
| N100 | 7.45*** | 0.098 | 7.57*** | 0.240 |

*No Ti-containing intermetallic phases present at interface
**CVD process 1: Ti-containing intermetallic phases at interface, CVD process 2: no Ti-containing intermetallic phases at interface
***Ti-containing ntermetallic phases at interface While the invention has been described in connection with various exemplary embodiments, it is to be understood that the invention is not to be limited to the disclosed exemplary embodiments; on the contrary, it is intended to cover various modifications and equivalent arrangements within the appended claims.

The invention claimed is:

1. A coated cutting tool comprising a substrate of cemented carbide and a coating, wherein the cemented carbide includes hard constituents in a metallic binder and wherein said metallic binder comprises 68 to 80 mol % Ni, 5-25 mol % Fe, 0-10 mol % Co, 4-15 mol % W, wherein the coating comprises, in order from the substrate an inner TiN layer and a TiCN layer, wherein C-activity relative to graphite in the metallic binder is lower than 0.15 and an average d electron value of the metallic binder is 7.00-7.43, and wherein an interface between the substrate and the inner TiN layer is free of Ti-containing intermetallic phase.

2. The coated cutting tool of claim 1, wherein the C-activity in the metallic binder is 0.095-0.120.

3. The coated cutting tool of claim 1, wherein the interface between the substrate and the inner TiN layer is free of Ti- and Ni-containing intermetallic phase.

4. The coated cutting tool of claim 1, wherein the interface between the substrate and inner TiN layer is free of Ti-, Fe- and Ni-containing intermetallic phase.

5. The coated cutting tool of claim 1, wherein the average d electron value is 7.25-7.43.

6. The coated cutting tool of claim 1, wherein the average d electron value is 7.36-7.43.

7. The coated cutting tool of claim 1, wherein the metallic binder comprises 73 to 80 mol % Ni, 5-15 mol % Fe, 1-5 mol % Co, 8-13 mol % W.

8. The coated cutting tool of claim 1, wherein the metallic binder content in the cemented carbide is 3-20 wt.

9. The coated cutting tool of claim 1, wherein a total thickness of the coating is 2-20 µm.

10. The coated cutting tool of claim 1, wherein the coating is a CVD coating.

11. The coated cutting tool of claim 1, wherein a thickness of the TiN layer is 0.1-1 µm deposited on the cemented carbide substrate.

12. The coated cutting tool of claim 1, wherein a thickness of the TiCN layer is 6-12 µm.

13. The coated cutting tool of claim 1, wherein the coating includes an $\alpha$-$Al_2O_3$ layer located between the TiCN layer and an outermost surface of the coated cutting tool.

14. The coated cutting tool of claim 1, wherein the thickness of the $\alpha$-$Al_2O_3$ layer located between the TiCN layer and an outermost surface of the coated cutting tool is 4-8 µm.

15. The coated cutting tool of claim 1, wherein said $\alpha$-$Al_2O_3$ layer exhibits a texture coefficient TC (h k l), as measured by X-ray diffraction using CuK$\alpha$ radiation and $\theta$-$2\theta$ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(h k l) is the measured intensity (integrated area) of the (h k l) reflection, $I_0$(h k l) is the standard intensity according to ICDD's PDF-card No. 00-010-0173, n is the number of reflections used in the calculation, and where the (h k l) reflections used are (1 0 4), (1 1 0), (1 1 3), (0 2 4), (1 1 6), (2 1 4), (3 0 0) and (0 0 12), wherein TC (0 0 12)$\geq$6.

16. The coated cutting tool of claim 1, wherein the CVD coating further comprises one or more layers selected from TiN, TiCN, AlTiN, ZrCN, $TiB_2$, $Al_2O_3$, or multilayers comprising $\alpha$-$Al_2O_3$ and/or $\kappa$-$Al_2O_3$.

* * * * *